(12) United States Patent  (10) Patent No.: US 9,120,059 B2
Daimon et al. (45) Date of Patent: Sep. 1, 2015

(54) VENTILATION UNIT

(75) Inventors: Atsushi Daimon, Osaka (JP); Kou Uemura, Osaka (JP); Youzou Yano, Osaka (JP)

(73) Assignee: Nitto Denko Corporation, Osaka (JP)

( * ) Notice: Subject to any disclaimer, the term of this patent is extended or adjusted under 35 U.S.C. 154(b) by 63 days.

(21) Appl. No.: 14/113,505

(22) PCT Filed: Jan. 10, 2012

(86) PCT No.: PCT/JP2012/000080
§ 371 (c)(1),
(2), (4) Date: Oct. 23, 2013

(87) PCT Pub. No.: WO2012/147240
PCT Pub. Date: Nov. 1, 2012

(65) Prior Publication Data
US 2014/0041520 A1 Feb. 13, 2014

(30) Foreign Application Priority Data
Apr. 27, 2011 (JP) .................... 2011-099879

(51) Int. Cl.
*B01D 53/22* (2006.01)
*B01D 69/10* (2006.01)
*B60R 16/00* (2006.01)
*H05K 5/02* (2006.01)

(52) U.S. Cl.
CPC ............... *B01D 69/10* (2013.01); *B60R 16/00* (2013.01); *H05K 5/0213* (2013.01)

(58) Field of Classification Search
CPC ........ B01D 53/22; B01D 53/04; B01D 46/00; B01D 53/02; B01D 46/10; B01D 29/05

USPC ........... 55/385.4, 502; 96/4; 95/45; 454/367; 123/41.86
See application file for complete search history.

(56) References Cited

U.S. PATENT DOCUMENTS

| 5,891,223 | A  | * | 4/1999 | Shaw et al. .................... 96/134 |
| 6,524,361 | B1 | * | 2/2003 | Thornton et al. ............ 55/385.4 |
| 6,994,621 | B2 |   | 2/2006 | Mashiko et al. |
| 7,678,169 | B1 | * | 3/2010 | Gwin et al. ................... 55/385.4 |
| 7,936,566 | B2 |   | 5/2011 | Shigyo et al. |

(Continued)

FOREIGN PATENT DOCUMENTS

| JP | 1-161507 U  | 11/1989 |
| JP | 4-043307 U  | 4/1992  |

(Continued)

*Primary Examiner* — Duane Smith
*Assistant Examiner* — Minh-Chau Pham
(74) *Attorney, Agent, or Firm* — Hamre, Schumann, Mueller & Larson, P.C.

(57) ABSTRACT

A ventilation unit (1A) includes: a ventilation member (2) configured to be attached to an opening (11) of a housing (10), the ventilation member (2) including a water-proof gas-permeable membrane (4) for covering the opening (11); a sealing member (6) configured to seal a gap between the housing (10) and the ventilation member (2); and an annular partition wall member (7A) defining an inner space in which the ventilation member (2) is fitted. The partition wall member (7A) is configured to keep in contact with the housing (10), and blocks a clearance formed outside the sealing member (6) and between a peripheral portion of the ventilation member (2) and the housing (10) when the ventilation member (2) is attached to the opening (11) of the housing (10).

16 Claims, 10 Drawing Sheets

(56) References Cited

U.S. PATENT DOCUMENTS

| | | | |
|---|---|---|---|
| 8,246,726 B2 * | 8/2012 | Yano | 96/4 |
| 8,814,993 B2 * | 8/2014 | Yano | 96/4 |
| 2002/0066370 A1 * | 6/2002 | Goglio et al. | 96/134 |
| 2006/0054019 A1 | 3/2006 | Waida | |
| 2008/0041624 A1 | 2/2008 | Sasaki et al. | |

FOREIGN PATENT DOCUMENTS

| | | |
|---|---|---|
| JP | 9-135085 | 5/1997 |
| JP | 2004-047425 | 2/2004 |
| JP | 2004-090875 | 3/2004 |
| JP | 2006-135250 | 5/2006 |
| JP | 2007-048585 | 2/2007 |
| JP | 2007-087666 | 4/2007 |
| JP | 2007-141959 | 6/2007 |
| JP | 2010-012842 | 1/2010 |
| JP | 2010-052701 | 3/2010 |
| JP | 2010-267538 | 11/2010 |
| WO | 2006/011496 | 2/2006 |

* cited by examiner

VENTILATION UNIT

TECHNICAL FIELD

The present invention relates to a ventilation unit including a ventilation member configured to be attached to an opening of a housing.

BACKGROUND ART

Conventionally, for example, in automobile electric components such as automobile lamps and ECUs (Electrical Control Units), OA (office automation) equipment, household electric appliances, and medical devices, a housing containing an electric component or a control board is provided with an opening for the purpose of reducing pressure variation in the housing caused by temperature change or allowing replacement of air in the housing, and a ventilation member is attached to the opening. The ventilation member ensures ventilation between the inside and outside of the housing and also prevents foreign matters such as dust and water from entering the housing.

For example, Patent Literature 1 discloses a ventilation member 100 as shown in FIGS. 9A and 9B. The ventilation member 100 includes: a water-proof gas-permeable membrane 120 for covering an opening 151 of a housing 150; a support 110 supporting the water-proof gas-permeable membrane 120 and configured to be fixed to the housing 150; and a cover component 130 covering the water-proof gas-permeable membrane 120.

The support 110 has a tubular shape as a whole, and includes: a flange portion 112 to which the water-proof gas-permeable membrane 120 is adhered; and an insertion portion 111 projecting from the flange portion 112 and configured to be inserted into the opening 151 of the housing 150. A sealing member 140 is mounted around the root portion of the insertion portion 111. The sealing member 140 is pressed against the housing 150 by the flange portion 112, so that a gap between the ventilation member 100 and the housing 150 is sealed.

The cover component 130 includes: a principal wall 131 facing the water-proof gas-permeable membrane 120; and a peripheral wall 132 extending from the peripheral portion of the principal wall 131 to the vicinity of a surface of the housing 150. In addition, the principal wall 131 is provided with through holes 133 for allowing a space facing the water-proof gas-permeable membrane 120 to communicate with the outside.

In addition, Patent Literature 2 discloses a ventilation structure 300 in which partition walls 152 are provided on the housing 150 so as to surround a ventilation member 200 as shown in FIGS. 10A and 10B. The partition walls 152 are arc-shaped walls spaced from each other, and have a height greater than that of the ventilation member 200.

CITATION LIST

Patent Literature

Patent Literature 1: JP 2007-87666 A
Patent Literature 2: JP 2004-47425 A

SUMMARY OF INVENTION

Technical Problem

For example, in the case of an electric component of an automobile, when the automobile is washed with high-pressure water, the electric component of the automobile may also be subjected to a jet of high-pressure water. In the case of using a ventilation member, a clearance is formed between the housing and a peripheral portion of the ventilation member that extends outwardly of a sealing member. Therefore, when the electric component of the automobile is subjected to a jet of high-pressure water as described above, a situation may arise where the high-pressure water acts on the sealing member through the clearance to deform the sealing member, and water consequently enters the housing.

However, when the cover component 130 has the peripheral wall 132 as in the ventilation member 100 disclosed in Patent Literature 1, the amount of high-pressure water acting on the sealing member 140 can be reduced. Nevertheless, in view of attachability and production error of the ventilation member 100, a clearance between the peripheral wall 132 and the housing 150 cannot be fully eliminated. Therefore, the possibility cannot be excluded that high-pressure water acts on the sealing member 140, and water consequently enters the housing.

Furthermore, in the case of the ventilation structure 300 disclosed in Patent Literature 2, a clearance between the partition walls 152 and the ventilation member 200 cannot be fully eliminated because a ventilation channel needs to be secured between the partition walls 152 and the ventilation member 200. Therefore, the ventilation structure 300 disclosed in Patent Literature 2 also has the same problem as the ventilation member 100 disclosed in Patent Literature 1.

In view of such circumstances, the present invention aims to provide a ventilation unit that can prevent foreign matters from entering a housing from between a ventilation member and the housing even in an environment where a high external pressure acts on the ventilation unit.

Solution to Problem

That is, the present invention provides a ventilation unit including: a ventilation member configured to be attached to an opening of a housing, the ventilation member including a water-proof gas-permeable membrane for covering the opening; a sealing member configured to seal a gap between the housing and the ventilation member; and an annular partition wall member defining an inner space in which the ventilation member is fitted, the partition wall member being configured to keep in contact with the housing.

Advantageous Effects of Invention

With the above configuration, when the ventilation member is attached to the opening of the housing, a clearance formed outside the sealing member and between a peripheral portion of the ventilation member and the housing is blocked by the partition wall member. Accordingly, it is possible to prevent foreign matters from entering the housing from between the ventilation member and the housing even in an environment where a high external pressure acts on the ventilation unit.

DESCRIPTION OF EMBODIMENTS

Hereinafter, embodiments of the present invention will be described with reference to the accompanying drawings. The following description relates to illustrative examples of the present invention, and the present invention is not limited by the examples.

(First Embodiment)

Figure 1:
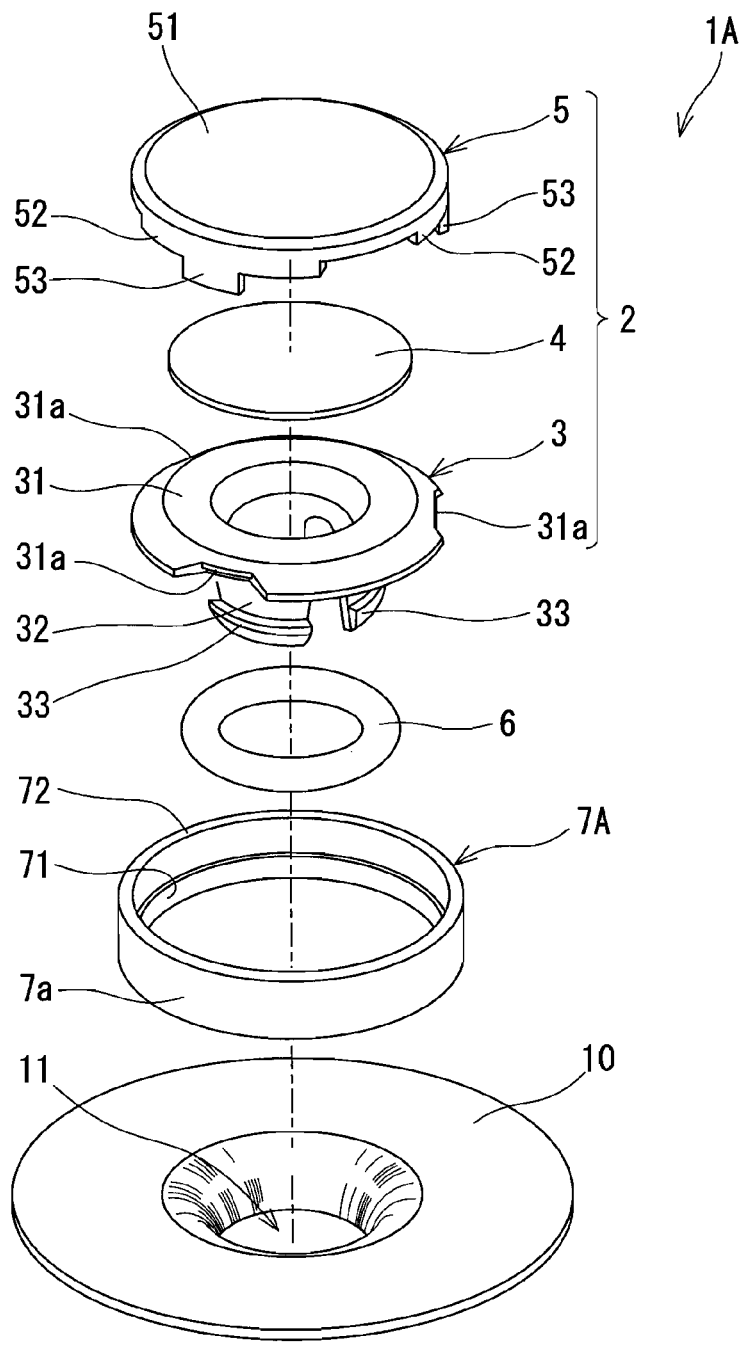
FIG. 1 is an exploded perspective view of a ventilation unit according to a first embodiment of the present invention.
Figure 2:
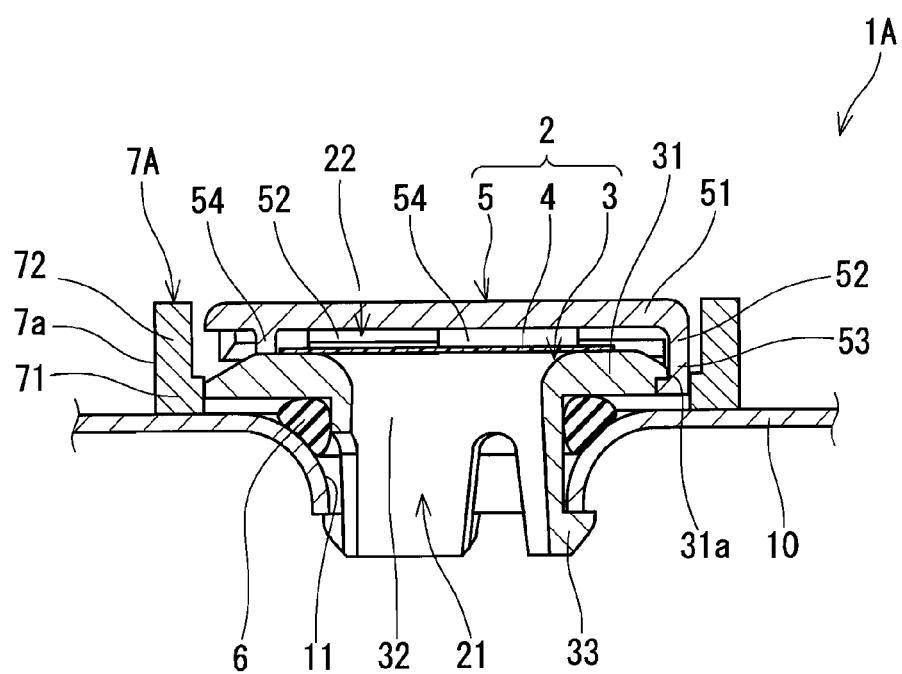
FIG. 2 is a cross-sectional view of the ventilation unit of FIG. 1.

A ventilation unit 1A according to a first embodiment of the present invention is shown in FIG. 1 and FIG. 2. The ventilation unit 1A includes: a ventilation member 2 configured to be attached to an opening 11 of a housing 10; a sealing member 6 configured to seal a gap between the housing 10 and the ventilation member 2; and an annular partition wall member 7A defining an inner space in which the ventilation member 2 is fitted.

Figure 8:
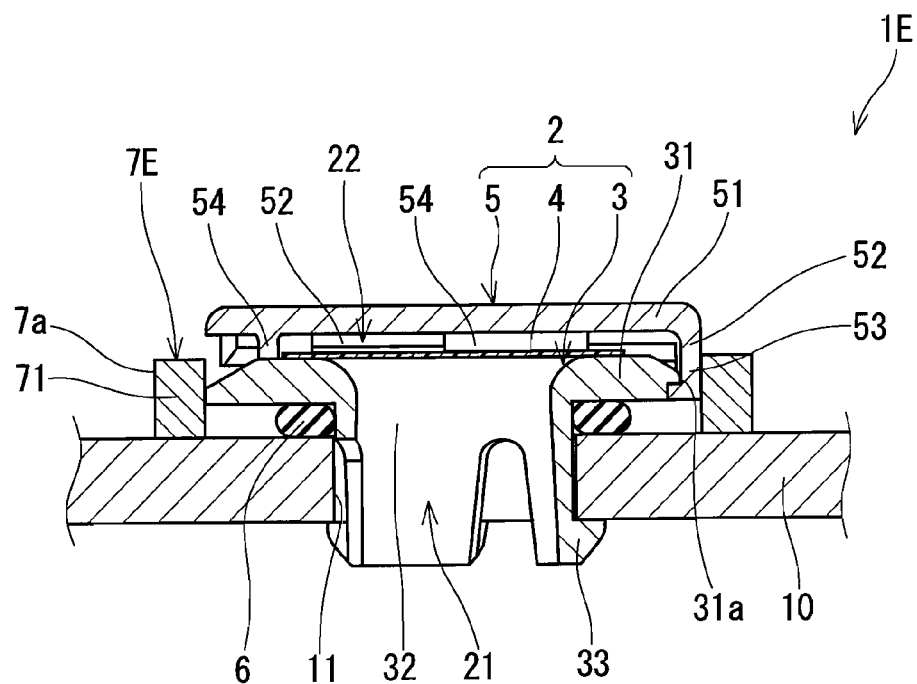
FIG. 8 is a cross-sectional view of a ventilation unit according to a fifth embodiment of the present invention.
Figure 9A:
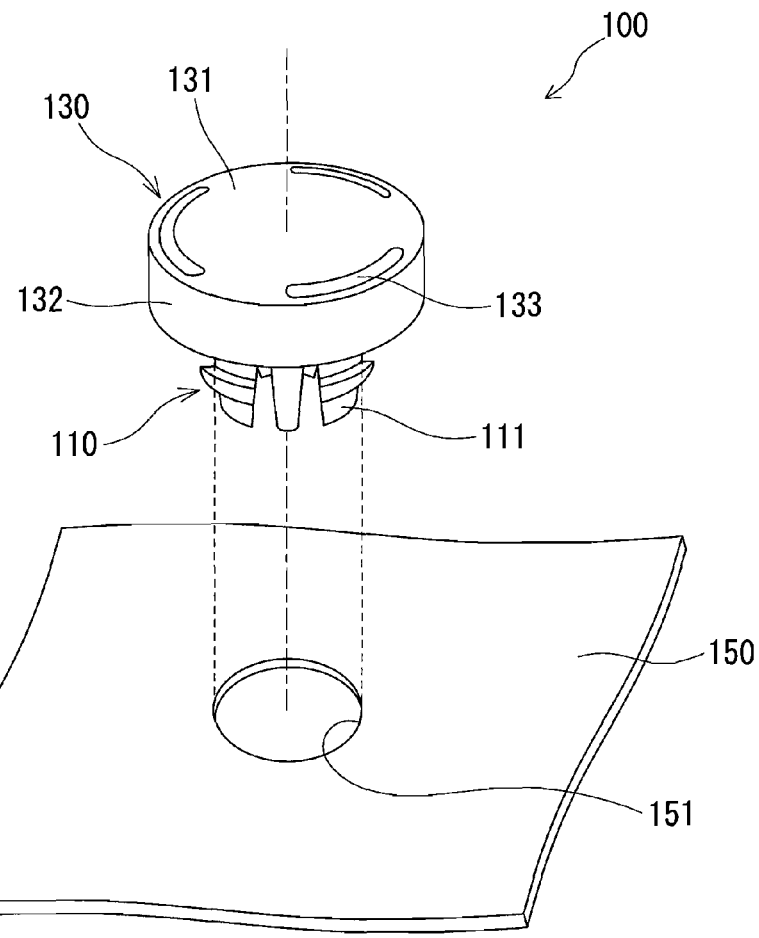
FIG. 9A is a perspective view of a conventional ventilation member.
Figure 9B:
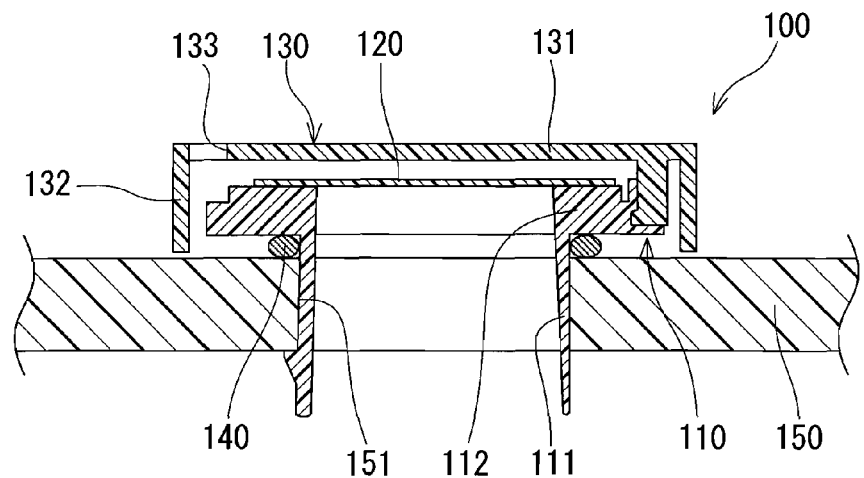
FIG. 9B is a cross-sectional view of the ventilation member.
Figure 10A:
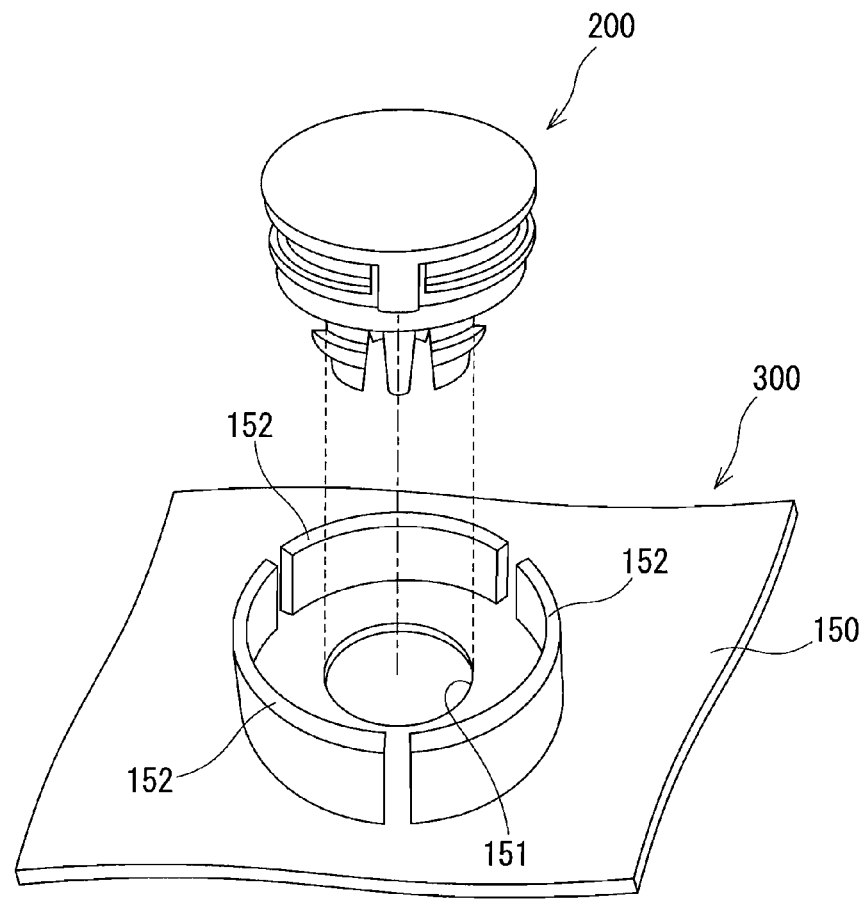
FIG. 10A is an exploded perspective view of a conventional ventilation structure.
Figure 10B:
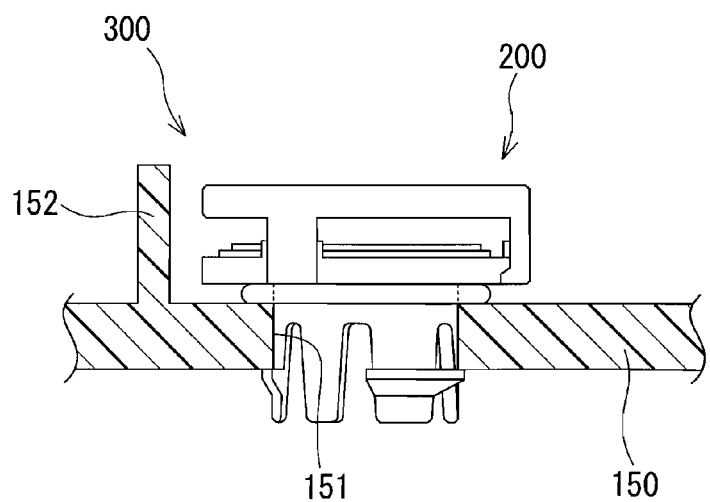
FIG. 10B is a cross-sectional view of the ventilation structure.

In the present embodiment, the opening 11 opens in a direction upwardly from the horizontal plane (in a vertically upward direction, for example). Hereinafter, for convenience of explanation, a direction in which the opening 11 opens (a direction toward the upper side in FIG. 2) may be referred to as an upward direction, and the opposite direction (a direction toward the lower side in FIG. 2) may be referred to as a downward direction. In the present embodiment, the opening 11 is formed by burring of a thin plate that is a constituent material of the housing 10. That is, the opening 11 has a diameter decreasing from the outside of the housing 10 toward the inside of the housing 10. However, the opening 11 is not limited to such an opening. For example, as shown in FIG. 8, the opening 11 may be a straight hole formed in a thick plate that is a constituent material of the housing 10.

The ventilation member 2 includes: a water-proof gas-permeable membrane 4 for covering the opening 11 of the housing 10; a support 3 supporting the water-proof gas-permeable membrane 4 and configured to be fixed to the housing 10; and a cover component 5 covering the water-proof gas-permeable membrane 4.

The water-proof gas-permeable membrane 4 may be any membrane that allows permeation of gases and that blocks permeation of liquids (e.g., a woven fabric, a non-woven fabric, a mesh, or a net, which is made of resin or metal), and the structure and material of the water-proof gas-permeable membrane 4 are not particularly limited. For example, the water-proof gas-permeable membrane 4 may have a configuration in which a reinforcing layer is laminated on a resin porous membrane. By providing a reinforcing layer, the waterproof gas-permeable membrane 4 of high strength can be obtained.

A fluororesin porous body or a polyolefin porous body that can be produced by a commonly-known stretching method or extraction method is usable as the material of the resin porous membrane. Examples of the fluororesin include PTFE (polytetrafluoroethylene), polychlorotrifluoroethylene, tetrafluoroethylene-hexafluoropropylene copolymer, and tetrafluoroethylene-ethylene copolymer. Examples of monomers constituting the polyolefin include ethylene, propylene, and 4-methylpentene-1,1-butene. A polyolefin obtained by polymerization of any one of these monomers or a polyolefin obtained by copolymerization of these monomers can be used. Alternatively, a nanofiber film porous body for which polyacrylonitrile, nylon, or polylactic acid is used can be used. In particular, it is preferable to use a PTFE porous body that can ensure gas permeability even with a small area and that functions well to prevent entry of foreign matters into the housing.

Depending on the environment in which the housing 10 is used, the resin porous membrane may be subjected to liquid-repellent treatment. The liquid-repellent treatment can be performed by applying a substance with low surface tension to the resin porous membrane, drying the substance, and then curing the substance. The liquid-repellent agent used for the liquid-repellent treatment may be any agent that allows formation of a coating having a lower surface tension than the resin porous membrane. For example, a liquid-repellent agent containing a polymer having a perfluoroalkyl group is suitable. The application of a liquid-repellent agent can be performed by impregnation, spraying, or the like. In addition, from the standpoint of ensuring sufficient waterproofness, the average pore diameter of the resin porous membrane is desirably 0.01 μm or more and 10 μm or less.

A material having better gas permeability than the resin porous membrane is preferably used as the material of the reinforcing layer. Specifically, a woven fabric, a non-woven fabric, a mesh, a net, a sponge, a foam, or a porous body, which is made of resin or metal, can be used. Examples of the method for joining together the resin porous membrane and the reinforcing layer include adhesive lamination, thermal lamination, heat welding, ultrasonic welding, and bonding using an adhesive.

It is advantageous that the thickness of the water-proof gas-permeable membrane 4 be adjusted, for example, within a range of 1 μm to 5 mm, in view of the strength and the ease of fixing to the support 3. The gas permeability of the resin porous membrane or the water-proof gas-permeable membrane 4 is preferably 0.1 to 300 sec/100 mL in terms of Gurley value.

The support 3 is provided with an inner gas channel 21 configured to allow the water-proof gas-permeable membrane 4 to communicate with the internal space of the housing 10. Specifically, the support 3 has a tubular shape as a whole, and includes: a flange portion 31 having an upper surface to which the water-proof gas-permeable membrane 4 is adhered; and an insertion portion 32 projecting from an under surface of the flange portion 31 and configured to be inserted into the opening 11 of the housing 10. The peripheral portion of the upper surface of the flange portion 31 is tapered so that the diameter increases toward the under surface of the flange portion 31.

A plurality of (in the example of the figure, three) engaging pieces that are radially elastically deformable are formed in the insertion portion 32 by making a plurality of cuts from the lower end of the lower portion of the insertion portion 32. A claw 33 projecting radially outwardly is provided at the lower end of each of these engaging pieces, and the claw 33 is engaged with the opening-surrounding portion of the housing 10.

The cover component 5 forms an outer gas channel 22 opening radially outwardly between the cover component 5 and the water-proof gas-permeable membrane 4 and between the cover component 5 and the support 3. Specifically, the cover component 5 includes: a principal wall 51 facing the water-proof gas-permeable membrane 4; and a plurality of (in the example of the figure, three) hanging walls 52 hanging downwardly from a peripheral portion of the principal wall 51. In the present embodiment, the diameter of the principal wall 51 is set equal to the outer diameter of the flange portion 31 of the support 3.

The hanging walls 52 are arranged at regular angular intervals, and each hanging wall 52 has a shape of an arc extending along the peripheral portion of the principal wall 51. Each hanging wall 52 extends from the under surface of the principal wall 51 beyond the water-proof gas-permeable membrane 4, and the end of the hanging wall 52 is located downwardly of the flat portion of the upper surface of the flange portion 31. In addition, the inner portion of the end of each hanging wall 52 is tapered so that a large space is secured between the inner portion and the tapered surface of the flange portion 31. Furthermore, a coupling piece 53 is provided at the center of each hanging wall 52, and extends from the lower end of the hanging wall 52 to the under surface of the flange portion 31.

Figure 3:
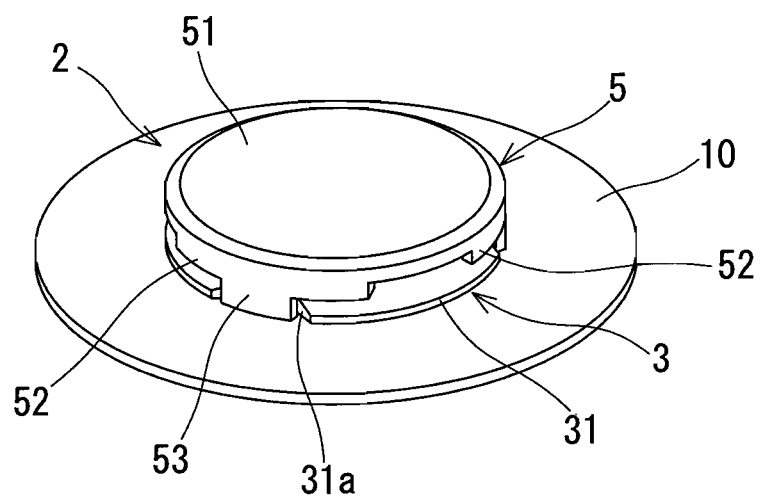
FIG. 3 is a perspective view of a ventilation member attached to an opening of a housing.

In addition, recesses 31a which open radially outwardly and with which the coupling pieces 53 can be engaged are provided in the flange portion 31 at positions corresponding to the coupling pieces 53. A claw projecting radially inwardly is provided at the end of each coupling piece 53, and the claw is engaged with a stepped portion provided in the recess 31a, so that the cover component 5 is coupled to the support 3. When the cover component 5 is coupled to the support 3, the outer surfaces of the coupling pieces 53 and the edge surface of the flange portion 31 form a single cylindrical surface as shown in FIG. 3.

Figure 4:
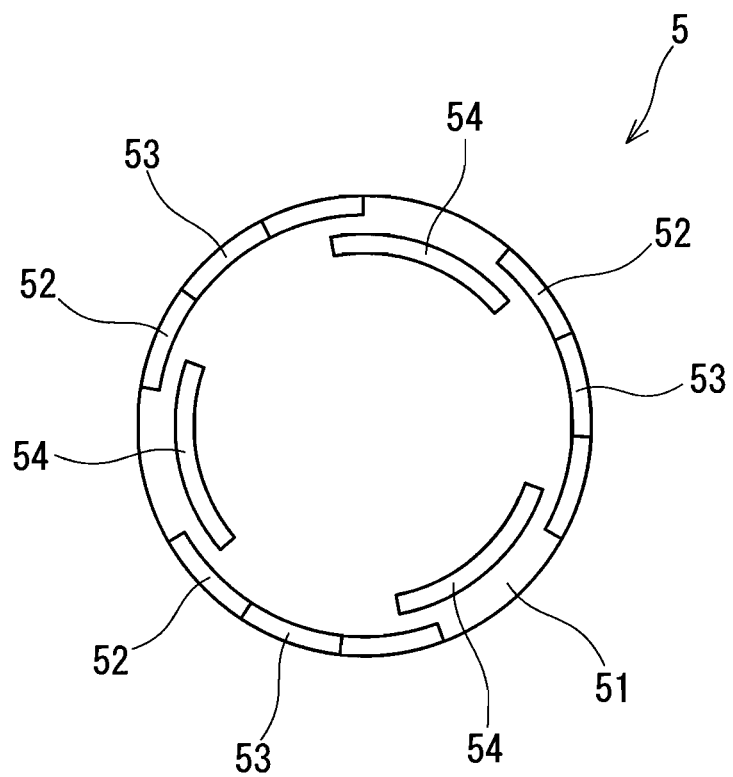
FIG. 4 is a bottom view of a cover component.

Furthermore, as shown in FIG. 4, a plurality of (in the example of the figure, three) arc-shaped inner walls 54 are provided on the under surface of the principal wall 51 in such a manner that a circle defined by the inner walls 54 is smaller than a circle defined by the hanging walls 52. The inner walls 54 are in contact with the flat portion of the upper surface of the flange portion 31, and a space is thus secured between the water-proof gas-permeable membrane 4 and the principal wall 51. In addition, the inner walls 54 are located radially inwardly of the hanging walls 52, and cover the clearances between the hanging walls 52 so as to hide the water-proof gas-permeable membrane 4 from the outside. In other words, the hanging walls 52 and the inner walls 54 form a labyrinth in the vicinity of the opening of the outer gas channel 22 so as to prevent the water-proof gas-permeable membrane 4 from being exposed directly to the outside through the outer gas channel 22.

Referring back to FIG. 1 and FIG. 2, the sealing member 6 is mounted around the root portion of the insertion portion 32 of the support 3. The sealing member 6 seals a gap between the ventilation member 2 and the housing 10 by being pressed against the housing 10 by the flange portion 31. An O-ring, a packing, or the like, can be used as the sealing member 6.

The partition wall member 7A is configured to keep in contact with the housing 10. In the present embodiment, the partition wall member 7A is placed on the housing 10 by its own weight, and the partition wall member 7A is thus kept in contact with the housing 10. Specifically, the partition wall member 7A includes: a main body portion 71 held by the support 3 radially from inside; and a cylindrical peripheral wall 72 rising from the main body portion 71 in such a manner as to form a clearance between the cover component 5 and the peripheral wall 72. More specifically, the main body portion 71 has a cylindrical inner peripheral surface defining a diameter that is equal to the outer diameter of the flange portion 31 of the support 3 or that is larger than the outer diameter of the flange portion 31 by a dimensional tolerance.

The main body portion 71 comes into contact with the housing 10, and allows at least a portion of the opening of the outer gas channel 22 to be exposed outwardly. The peripheral wall 72 faces the opening of the outer gas channel 22. In the present embodiment, the outer surface of the main body portion 71 and the outer surface of the peripheral wall 72 are continuous with each other in the axial direction of the partition wall member 7A, and form a cylindrical outer peripheral surface 7a of the partition wall member 7A.

The partition wall member 7A (the main body portion 71 and the peripheral wall 72) may be formed of an elastic material such as a rubber. In this case, the diameter of the main body portion 71 defined by the inner peripheral surface may be set smaller than the outer diameter of the flange portion 31, and the partition wall member 7A may be kept in contact with the housing 10 by press-fitting the flange portion 31 into the main body portion 71. However, in the present embodiment, the partition wall member 7A is formed of a hard material such as a plastic and a metal, and the main body portion 71 is freely slidable relative to the flange portion 31 by virtue of the above-described dimensional relationship.

The partition wall member 7A preferably has a height equal to or slightly less than the distance from the surface of the housing 10 to the top (the upper surface of the principal wall 51 in the present embodiment) of the cover component 5 of the ventilation member 2 attached to the opening 11 of the housing 10. Here, the phrase "slightly less than" means that the height of the partition wall member 7A is 90% or more of the distance from the surface of the housing 10 to the top of the cover component 5. In such a case, for example, when the ventilation member 2 is pressed into the opening 11 with a jig having a larger area than the ventilation member 2, the partition wall member 7A serves as a stopper for restricting the displacement of the jig, and the ventilation member 2 or the housing 10 can thus be prevented from being broken due to too tight pressing.

In the case of the ventilation unit 1A having been described above, when the ventilation member 2 is attached to the opening 11 of the housing 10, a clearance formed outside the sealing member 6 and between the peripheral portion of the ventilation member 2 and the housing 10 is blocked by the partition wall member 7A. Therefore, even in an environment where a high external pressures acts on the ventilation unit, it is possible to prevent foreign matters entering the housing from between the ventilation member 2 and the housing 10.

Furthermore, in the present embodiment, the water-proof gas-permeable membrane 4 is not exposed directly to the outside by virtue of the hanging walls 52 and the inner walls 54 of the cover component 5. Accordingly, for example, the water-proof gas-permeable membrane 4 is not directly subjected to a jet of high-pressure water, and breakage of the water-proof gas-permeable membrane 4 can be prevented.

(Second Embodiment)

Figure 5:
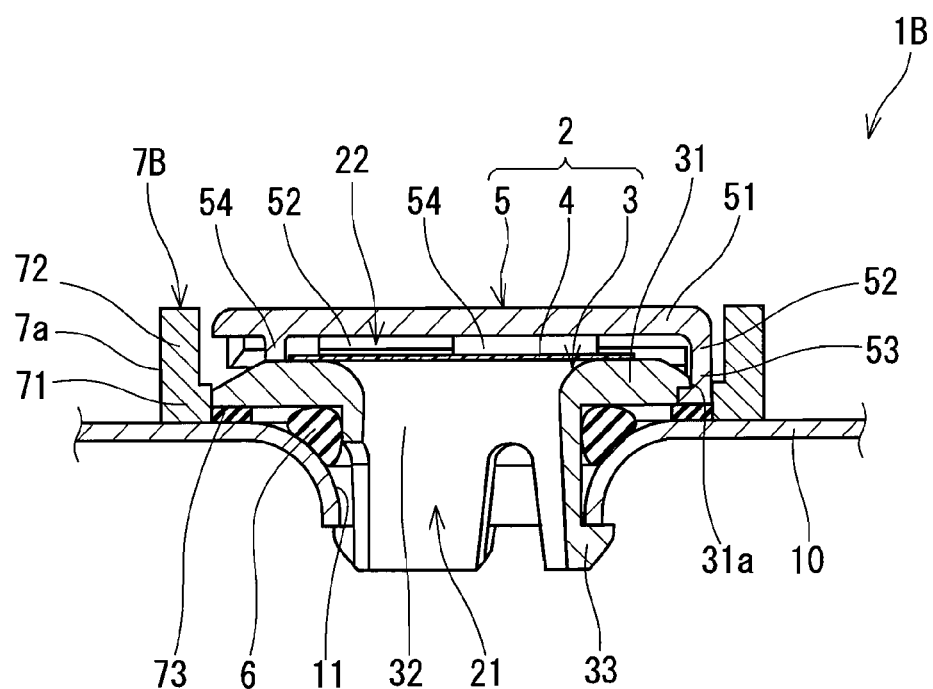
FIG. 5 is a cross-sectional view of a ventilation unit according to a second embodiment of the present invention.

Next, a ventilation unit 1B according to a second embodiment of the present invention will be described with reference to FIG. 5. In the present embodiment, the same components as those described in the first embodiment are denoted by the same reference characters, and the description thereof is omitted in some cases. This also applies to third to fifth embodiments described later.

The ventilation unit 1B of the present embodiment has the same components as the ventilation unit 1A of the first embodiment except for a partition wall member 7B. The partition wall member 7B used in the present embodiment further includes a jutting portion 73 in addition to the components of the partition wall member 7A described in the first embodiment.

The jutting portion 73 juts from the main body portion 71 radially inwardly so as to be sandwiched between the housing 10 and the ventilation member 2, and is in the form of a ring. In the case where the partition wall member 7B provided with such a jutting portion 73 is used, the jutting portion 73 serves as a stopper for restricting the displacement of the ventilation member 2 when the ventilation member 2 is pressed into the opening 11. Therefore, even if the height of the partition wall member 7B is low, the ventilation member 2 or the housing 10 can be prevented from being broken due to too tight pressing. In addition, it is also possible to prevent the partition wall member 7B from being detached from the ventilation member 2 such as due to vibration.

The jutting portion 73 may have a thickness equal to or less than the distance by which the peripheral portion of the ventilation member 2 attached to the opening 11 of the housing 10 is spaced from the housing 10. In this case, the jutting portion 73 can be formed of the same hard material as the main body portion 71 and the peripheral wall 72, and these components can be formed integrally.

However, it is preferable that the jutting portion 73 be formed of an elastic material such as a rubber, and the thickness of the jutting portion 73 in a natural state be greater than the distance by which the peripheral portion of the ventilation member 2 attached to the opening 11 of the housing 10 is spaced from the housing 10. In this case, the partition wall member 7B is kept in contact with the housing 10 by the jutting portion 73 being pressed against the housing 10 by the ventilation member 2. Therefore, the partition wall member 7B can be used regardless of which direction (e.g., a vertically downward direction) the opening 11 faces in. Furthermore, even when, for example, high-pressure water or the like applies a force to the partition wall member 7B in a direction away from the housing 10, the partition wall member 7 is not detached from the housing 10, and therefore, a sealing structure can be provided also outside the sealing member 6.

In the case where the jutting portion 73 is formed of a material different from that of the main body portion 71, the jutting portion 73 may be joined to the main body portion 71 with an adhesive or the like.

(Third Embodiment)

Figure 6:
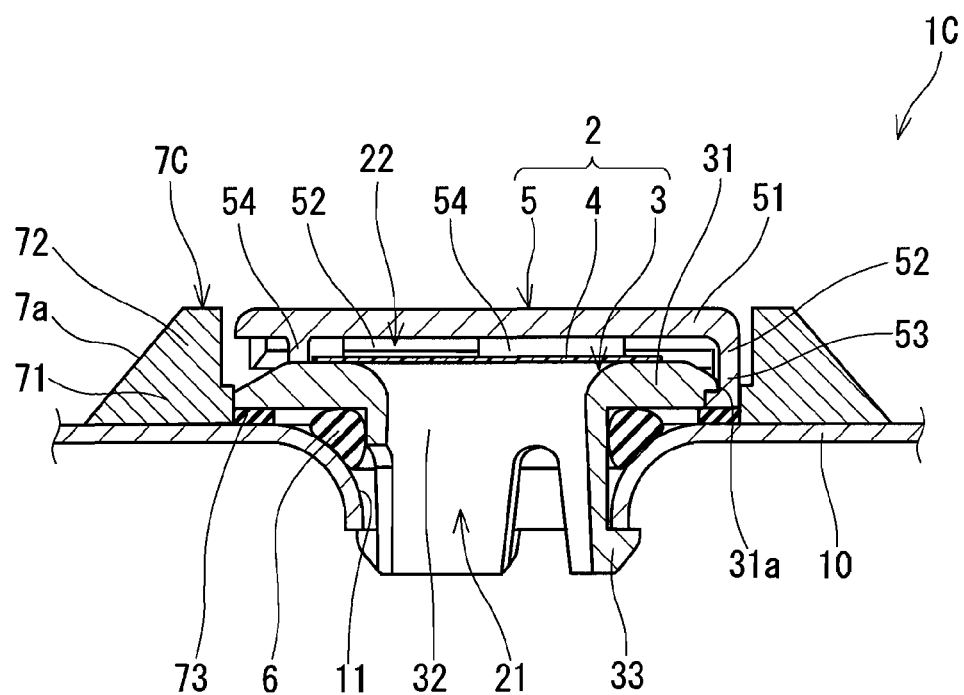
FIG. 6 is a cross-sectional view of a ventilation unit according to a third embodiment of the present invention.

Next, a ventilation unit 1C according to a third embodiment of the present invention will be described with reference to FIG. 6. In the present embodiment, a partition wall member 7C is used whose difference from the partition wall member 7B described in the second embodiment lies only in the outer peripheral surface 7a.

The outer peripheral surface 7a of the partition wall member 7C flares toward the housing 10. The outer peripheral surface 7a may be a tapered surface that presents a straight line in a cross-section, or may be a concave surface or a convex surface that presents a curved line in a cross-section. In the case where the partition wall member 7C having such an outer peripheral surface 7a is used, in an environment where a high external pressure acts on the ventilation unit, the partition wall member 7C is pressed firmly against the housing 10 by the external pressure. Therefore, it is possible to more reliably prevent foreign matters from entering the housing from between the ventilation member 2 and the housing 10.

(Fourth Embodiment)

Figure 7:
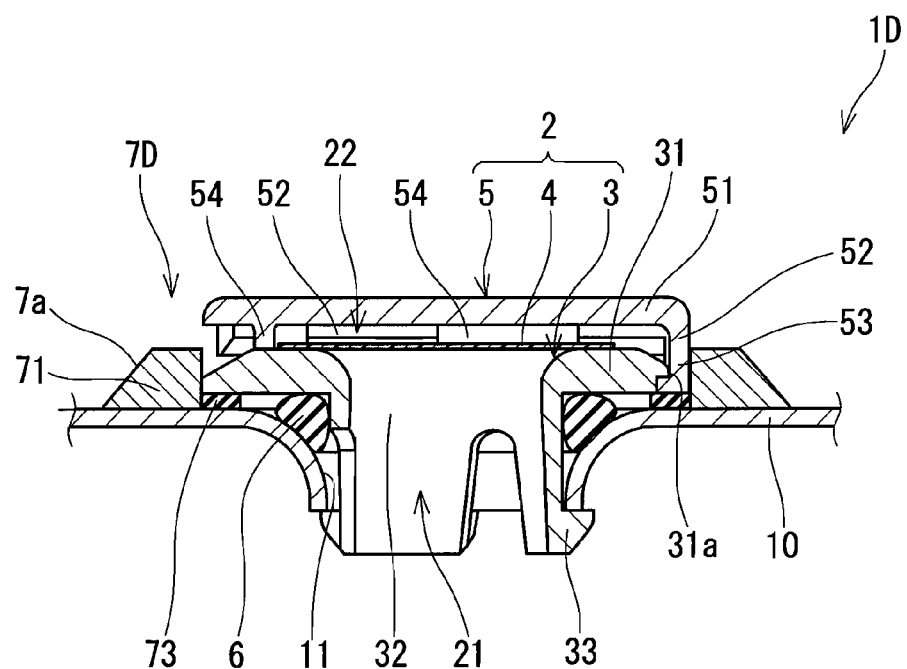
FIG. 7 is a cross-sectional view of a ventilation unit according to a fourth embodiment of the present invention.

Next, a ventilation unit 1D according to a fourth embodiment of the present invention will be described with reference to FIG. 7. In the present embodiment, a partition wall member 7D is used that corresponds to one obtained by removing the peripheral wall 72 from the partition wall member 7C described in the third embodiment.

The partition wall member 7D consists only of the main body portion 71 and the jutting portion 73. That is, the partition wall member 7D has a height equal to the height of the main body portion 71. In other words, the top surface of the main body portion 71 constitutes the upper end surface of the partition wall member 7D. In the present embodiment, the height of the partition wall member 7D is preferably equal to or less than the distance from the surface of the housing 10 to the water-proof gas-permeable membrane 4 of the ventilation member 2 attached to the opening 11 of the housing 10.

With the configuration of the present embodiment, even when water flows into the outer gas channel 22, the water is quickly discharged to the outside beyond the partition wall member 7D. Therefore, water accumulation on the water-proof gas-permeable membrane 4 can be restrained.

(Fifth Embodiment)

Next, a ventilation unit 1E according to a fifth embodiment of the present invention will be described with reference to FIG. 8. In the present embodiment, a partition wall member 7E consisting only of the main body portion 71 and having a rectangular cross-sectional shape is used. In addition, the opening 11 of the housing 10 is a straight hole, and the distance by which the peripheral portion of the ventilation member 2 is spaced from the housing 10 is greater than in the first to fourth embodiments.

Also with the configuration of the present embodiment, when the ventilation member 2 is attached to the opening 11 of the housing 10, a clearance formed outside the sealing member 6 and between the peripheral portion of the ventilation member 2 and the housing 10 is blocked by the partition wall member 7E. Accordingly, it is possible to prevent foreign matters from entering the housing from between the ventilation member 2 and the housing 10 even in an environment where a high external pressure acts on the ventilation unit.

The invention claimed is:

1. A ventilation structure comprising a ventilation unit and a housing,
   the ventilation unit comprising:
   a ventilation member that is attached to an opening of the housing, the ventilation member comprising a water-proof gas-permeable membrane that covers the opening;
   a sealing member that seals a gap between the housing and the ventilation member; and
   an annular partition wall member defining an inner space in which the ventilation member is fitted, the partition wall member being kept in contact with the housing, wherein
   the ventilation member comprises:
   a support supporting the water-proof gas-permeable membrane and having an inner gas channel configured to allow the water-proof gas-permeable membrane to communicate with an internal space of the housing; and
   a cover component covering the water-proof gas-permeable membrane and forming an outer gas channel opening radially outwardly between the cover component and the water-proof gas-permeable membrane and between the cover component and the support,
   the partition wall member comprises a main body portion held by the support radially from inside, the main body portion being in contact with the housing and allowing at least a portion of an opening of the outer gas channel to be exposed outwardly, and
   the partition wall member comprises a jutting portion jutting from the main body portion radially inwardly, the jutting portion being sandwiched between the housing and the ventilation member.

2. The ventilation structure according to claim 1, wherein the partition wall member comprises a peripheral wall rising from the main body portion in such a manner as to form a clearance between the cover component and the peripheral wall, the peripheral wall facing the opening of the outer gas channel.

3. The ventilation structure according to claim 2, wherein
the main body portion and the peripheral wall are formed of a hard material, and
the partition wall member has a height equal to or slightly less than a distance from a surface of the housing to a top of the cover component of the ventilation member.

4. The ventilation structure according to claim 1, wherein the partition wall member has a height equal to that of the main body portion.

5. The ventilation structure according to claim 4, wherein the height of the partition wall member is equal to or less than a distance from a surface of the housing to the water-proof gas-permeable membrane of the ventilation member.

6. The ventilation structure according to claim 1, wherein
the jutting portion is formed of an elastic material, and
the jutting portion in a natural state has a thickness greater than a distance by which a peripheral portion of the ventilation member is spaced from the housing.

7. The ventilation structure according to claim 1, wherein the cover component comprises: a principal wall facing the water-proof gas-permeable membrane; a plurality of hanging walls hanging downwardly from a peripheral portion of the principal wall and extending beyond the water-proof gas-permeable membrane; and a plurality of inner walls located radially inwardly of the plurality of hanging walls, being in contact with the support, and covering clearances between the plurality of hanging walls so as to hide the water-proof gas-permeable membrane from outside.

8. The ventilation structure according to claim 1, wherein the partition wall member has an outer peripheral surface flaring toward the housing.

9. The ventilation structure according to claim 3, wherein the height of the partition wall member is 90% or more and 100% or less than the distance from the surface of the housing to the top of the cover component of the ventilation member.

10. A ventilation structure comprising a ventilation unit and a housing,
the ventilation unit comprising:
a ventilation member that is attached to an opening of the housing, the ventilation member comprising a water-proof gas-permeable membrane that covers the opening;
a sealing member that seals a gap between the housing and the ventilation member; and
an annular partition wall member defining an inner space in which the ventilation member is fitted, the partition wall member being kept in contact with the housing, wherein
the ventilation member comprises:
a support supporting the water-proof gas-permeable membrane and having an inner gas channel configured to allow the water-proof gas-permeable membrane to communicate with an internal space of the housing; and
a cover component covering the water-proof gas-permeable membrane and forming an outer gas channel opening radially outwardly between the cover component and the water-proof gas-permeable membrane and between the cover component and the support,
the partition wall member comprises a main body portion held by the support radially from inside, the main body portion being in contact with the housing and allowing at least a portion of an opening of the outer gas channel to be exposed outwardly, and
the cover component comprises: a principal wall facing the water-proof gas-permeable membrane; a plurality of hanging walls hanging downwardly from a peripheral portion of the principal wall and extending beyond the water-proof gas-permeable membrane; and a plurality of inner walls located radially inwardly of the plurality of hanging walls, being in contact with the support, and covering clearances between the plurality of hanging walls so as to hide the water-proof gas-permeable membrane from outside.

11. The ventilation structure according to claim 10, wherein the partition wall member comprises a peripheral wall rising from the main body portion in such a manner as to form a clearance between the cover component and the peripheral wall, the peripheral wall facing the opening of the outer gas channel.

12. The ventilation structure according to claim 11, wherein
the main body portion and the peripheral wall are formed of a hard material, and
the partition wall member has a height equal to or slightly less than a distance from a surface of the housing to a top of the cover component of the ventilation member.

13. The ventilation structure according to claim 10, wherein the partition wall member has a height equal to that of the main body portion.

14. The ventilation structure according to claim 13, wherein the height of the partition wall member is equal to or less than a distance from a surface of the housing to the water-proof gas-permeable membrane of the ventilation member.

15. The ventilation structure according to claim 10, wherein the partition wall member has an outer peripheral surface flaring toward the housing.

16. The ventilation structure according to claim 12, wherein the height of the partition wall member is 90% or more and 100% or less than the distance from the surface of the housing to the top of the cover component of the ventilation member.

* * * * *